United States Patent
Jones et al.

(10) Patent No.: US 9,236,863 B2
(45) Date of Patent: Jan. 12, 2016

(54) COMPENSATED IMPEDANCE CALIBRATION CIRCUIT

(71) Applicant: GLOBALFOUNDRIES INC., Grand Cayman (KY)

(72) Inventors: Brian D. Jones, Jamaica Plains, MA (US); Jeffrey H. Sloan, Richmond, VT (US); Xiaopeng Wang, McAllen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/519,630

(22) Filed: Oct. 21, 2014

(65) Prior Publication Data

US 2015/0035559 A1 Feb. 5, 2015

Related U.S. Application Data

(62) Division of application No. 13/732,713, filed on Jan. 2, 2013.

(51) Int. Cl.
| | |
|---|---|
| *H03K 19/00* | (2006.01) |
| *H03K 19/0175* | (2006.01) |
| *H04L 25/02* | (2006.01) |
| *G06F 17/50* | (2006.01) |
| *H03K 19/003* | (2006.01) |

(52) U.S. Cl.
CPC ...... *H03K 19/0005* (2013.01); *H03K 19/00361* (2013.01); *H03K 19/017545* (2013.01)

(58) Field of Classification Search
CPC ........... H04L 25/0278; H04L 25/0298; H03K 19/0005; G06F 17/505; G06F 17/5054; G06F 17/5068; H03H 7/38; H01L 2924/3011; H01P 5/02; H01P 5/103; H01P 5/026
USPC ......... 326/30; 716/132; 333/32–34; 327/108; 710/106

See application file for complete search history.

(56) References Cited

U.S. PATENT DOCUMENTS

| | | | |
|---|---|---|---|
| 3,457,493 A | 7/1969 | Shoemaker et al. | |
| 3,776,040 A * | 12/1973 | Gould, III | 374/185 |
| 6,541,996 B1 | 4/2003 | Rosefield et al. | |
| 6,636,821 B2 | 10/2003 | Lawson | |
| 6,828,820 B2 | 12/2004 | Ohno | |
| 7,061,266 B2 | 6/2006 | Sagiv | |
| 7,227,376 B2 | 6/2007 | Ahmad et al. | |
| 7,285,415 B2 | 10/2007 | Keirstead et al. | |

(Continued)

OTHER PUBLICATIONS

U.S. Appl. No. 13/732,713, Notice of Allowance and Fees Due dated Sep. 9, 2014.

(Continued)

*Primary Examiner* — Dylan White
(74) *Attorney, Agent, or Firm* — David Cain; Hoffman Warnick LLC

(57) ABSTRACT

Aspects of the invention provide for compensating impedance calibration circuits. In one embodiment, a compensated impedance calibration circuit, includes: a variable resistor network including a tunable resistor and a fixed resistor; and an external resistance network including a target external precision resistor and a parasitic distribution resistance; wherein a resistance of the variable resistor network is proportional to a resistance of the external resistance network, such that a ratio of an output voltage of the variable resistor network to a power supply voltage is constant.

13 Claims, 5 Drawing Sheets

(56) References Cited

U.S. PATENT DOCUMENTS

| | | |
|---|---|---|
| 7,408,379 B2 | 8/2008 | Cho et al. |
| 7,642,809 B2 | 1/2010 | Malekkhosravi et al. |
| 7,952,382 B2 * | 5/2011 | Moon .............................. 326/30 |
| 8,390,318 B2 | 3/2013 | Yokou et al. |
| 8,508,252 B2 * | 8/2013 | Farjadrad ........................ 326/30 |
| 8,633,733 B2 * | 1/2014 | Dettloff et al. ................. 326/82 |
| 2004/0207451 A1 | 10/2004 | Kitagawa et al. |
| 2014/0184267 A1 * | 7/2014 | Jones et al. ..................... 326/30 |

OTHER PUBLICATIONS

Office Action Communication for U.S. Appl. No. 13/732,713, dated Mar. 18, 2015, 10 Pages.

Office Action Communication for U.S. Appl. No. 13/732,713, dated Jul. 10, 2015, 18 Pages.

* cited by examiner

COMPENSATED IMPEDANCE CALIBRATION CIRCUIT

FIELD OF THE INVENTION

The disclosure relates generally to calibration circuits, and more particularly, to compensated impedance calibration circuits, and a related method.

BACKGROUND

Traditional input/output (I/O) driver impedance calibration circuits normally experience parasitic external resistance in the pin and package distribution network. This parasitic resistance incorporates a resistance on each side of an external precision target resistor. However, this parasitic resistance is usually limited to a small value.

However, for a 1:1 calibration architecture with a low impedance and a tight tolerance, the parasitic external resistance variation may consume a large amount of the tolerance budget. For example, if the impedance is 40 ohms, and there is a tolerance of 10% (±4 ohms), a small resistance of 1.5 ohms on either side of the external precision target resistor (total of 3 ohms) takes up 3.8% of the 10% tolerance.

BRIEF SUMMARY

Aspects of the invention provide for compensating impedance calibration circuits. In one embodiment, a compensated impedance calibration circuit, comprising: a variable resistor network including a tunable resistor and a fixed resistor; and an external resistance network including a target external precision resistor and a parasitic distribution resistance; wherein a resistance of the variable resistor network is proportional to a resistance of the external resistance network, such that a ratio of an output voltage of the variable resistor network to a power supply voltage is constant.

A first aspect of the disclosure provides a compensated impedance calibration circuit, comprising: a variable resistor network including a tunable resistor and a fixed resistor; and an external resistance network including a target external precision resistor and a parasitic distribution resistance; wherein a resistance of the variable resistor network is proportional to a resistance of the external resistance network, such that a ratio of an output voltage of the variable resistor network to a power supply voltage is constant.

A second aspect of the disclosure provides a method of designing a compensated calibration circuit, comprising: determining a minimum and a maximum resistance for a parasitic distribution resistance; determining a value of a precision target resistor; calculating a minimum and a maximum resistance for an external resistance network, based on the minimum and the maximum parasitic distribution resistance and the precision target resistor; and calculating a minimum and a maximum resistance for a fixed resistor, based on the minimum and the maximum resistance for the external resistance network and a chosen tunable resistor.

A third aspect of the disclosure provides a computer-implemented method of designing a compensated calibration circuit, comprising: determining a minimum and a maximum resistance for a parasitic distribution resistance; determining a value of a precision target resistor; calculating a minimum and a maximum resistance for an external resistance network, based on the minimum and the maximum parasitic distribution resistance and the precision target resistor; and calculating a minimum and a maximum resistance for a fixed resistor, based on the minimum and the maximum resistance for the external resistance network and a chosen tunable resistor.

BRIEF DESCRIPTION OF THE DRAWINGS

The above and other aspects, features and advantages of the disclosure will be better understood by reading the following more particular description of the disclosure in conjunction with the accompanying drawings.

Figure 1:
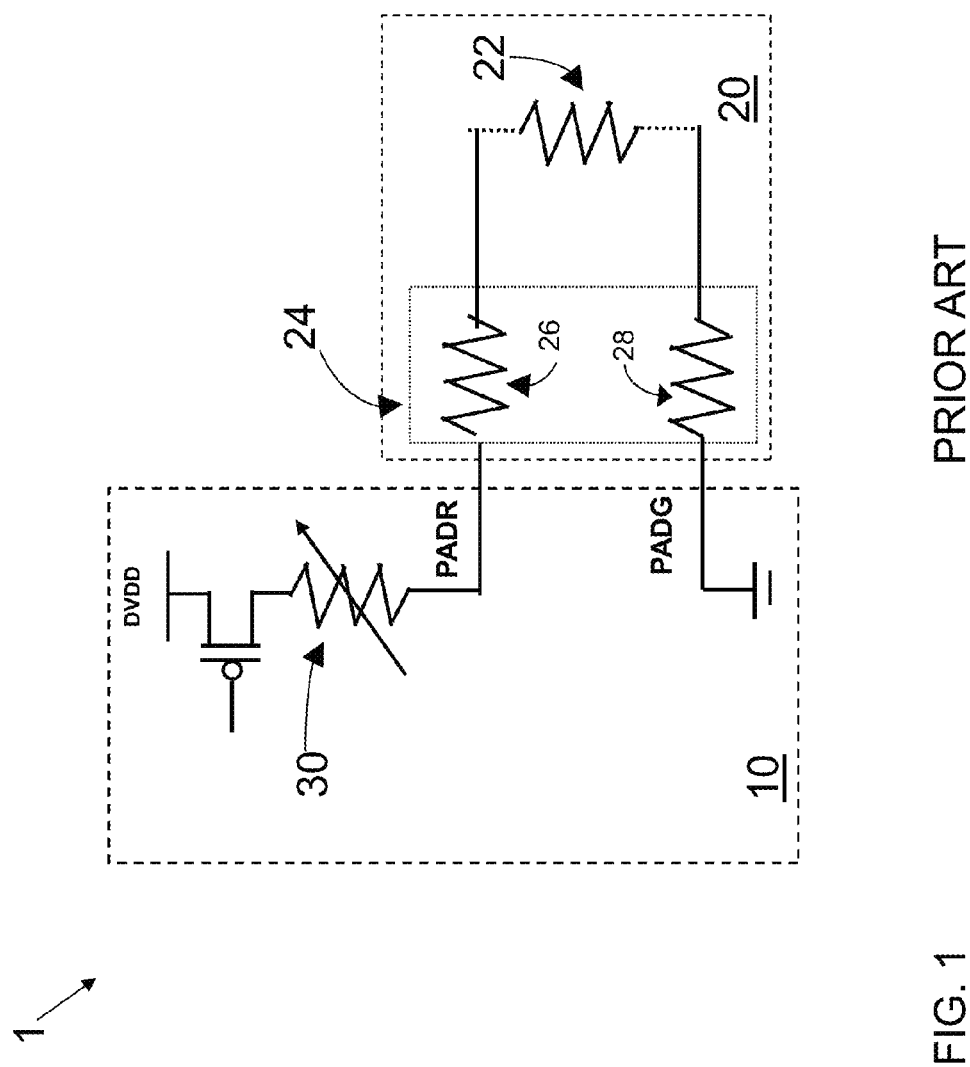
FIG. 1 shows a circuit diagram of a conventional impedance calibration circuit.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

The disclosure relates generally to calibration circuits, and more particularly, to compensated impedance calibration circuits, and a related method.

Traditional input/output (I/O) driver impedance calibration circuits normally experience parasitic external resistance in the pin and package distribution network. This parasitic resistance incorporates a resistance on each side of an external precision target resistor. However, this parasitic resistance is usually limited to a small value.

However, for a 1:1 calibration architecture with a low impedance and a tight tolerance, the parasitic external resistance variation may consume a large amount of the tolerance budget. For example, if the impedance is 40 ohms, and there is a tolerance of 10% (±4 ohms), a small resistance of 1.5 ohms on either side of the external precision target resistor (total of 3 ohms) takes up 3.8% of the 10% tolerance.

Turning now to the figures, in FIG. 1, a circuit diagram of a conventional calibration circuit 1 is shown. The calibration circuit 1 includes a chip side portion 10 and an external resistance network 20. In the external resistance network 20, there is a target precision resistor 22 and a parasitic distribution resistance 24. The parasitic distribution resistance 24 is formed by two resistors 26, 28 that are on either side of the target precision resistor 22 (i.e., in series with the target precision resistor 22).

Figure 2:
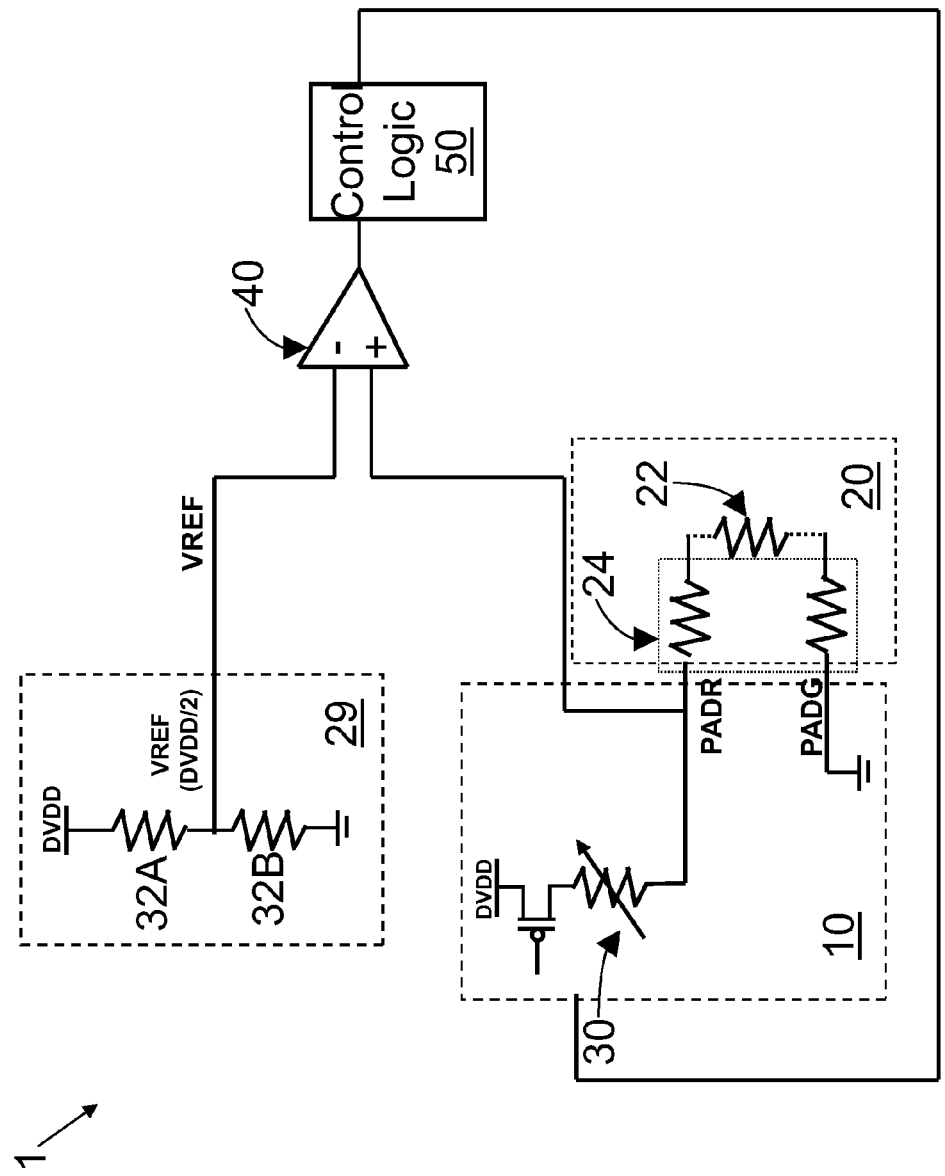
FIG. 2 shows a circuit diagram of a conventional impedance calibration circuit.

Turning now to FIG. 2, a more detailed circuit diagram of a conventional calibrated circuit 1 is shown. The circuit 1 includes a voltage generator 29, a comparator 40, and control logic 50. In conventional operation, a ratio of the target precision resistor 22 to a tunable resistor 30 within the chip 10 sets an internal voltage ("PADR"). In comparing (via comparator 40) the internal voltage ("PADR") to a reference voltage ("VREF") that is generated by voltage generator 29, the value of the tunable resistor 30 is tuned, via control logic 50 to achieve the correct output resistance. The voltage generator 29 may comprise, for example, a voltage divider, as known in the art, between two resistors 32A, 32B.

However, when the target precision resistor 22 in the external resistance network 20 is small (e.g., less than 40 ohms), the parasitic distribution resistance 24 provided by resistors 26, 28 consumes a large portion of the tolerance budget.

Aspects of the invention provide for compensating impedance calibration circuits. In one embodiment, a compensated impedance calibration circuit is provided. The circuit includes: a variable resistor network including a tunable resistor and a fixed resistor; and an external resistance network including a target external precision resistor and a parasitic distribution resistance; wherein a resistance of the variable resistor network is proportional to a resistance of the external resistance network, such that a ratio of an output voltage of the variable resistor network to a power supply voltage is constant.

Figure 3:
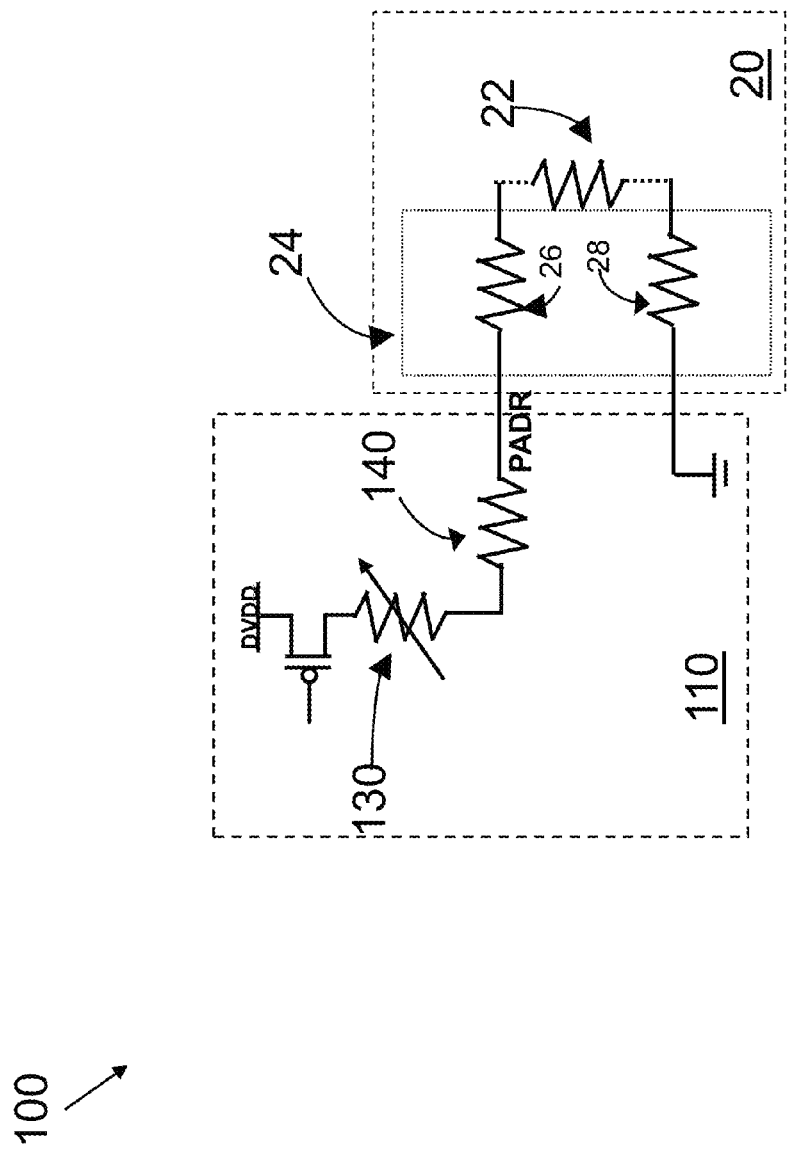
FIG. 3 shows a circuit diagram of a compensated impedance calibration circuit according to embodiments of the invention.

Turning now to FIG. 3, a circuit diagram of a compensated calibration circuit 100 according to aspects of the invention is shown. Similar to the calibration circuit 1 shown in FIGS. 1 and 2, there is an external resistance network 20 including a target external precision resistor 22 and a parasitic distribution resistance 24 (resistors 26, 28). However, compensated calibration circuit 100 includes a variable resistor network 110 that includes a tunable resistor 130 and also a fixed resistor 140. As will be described herein, the fixed resistor 140 is "fixed" in terms of a value, as compared to tunable resistor 130, which may be tuned. However, the fixed resistor 140, as will be described later, is a "pluggable" resistor. That is, the resistance value of the fixed resistor 140 may be a range of discrete values, depending on the external resistance network 20. The range of discrete values for the fixed resistor 140 will be such that the variable resistor network 110 is proportional to the external resistance network 20. Therefore, the ratio of the output voltage ("PADR") of the variable resistor network 110 to a power supply voltage ("DVDD") is constant. The following equation represents the ratio:

$$\frac{PADR}{DVDD} = \frac{R_{ext(tgt)} + R_{dist}}{R_{tuned} + R_{fix(plg)} + R_{ext(tgt)} + R_{dist}}$$

where $R_{ext(tgt)}$ is the value of the target external precision resistor 22, $R_{dist}$ is the value of the parasitic distribution resistance 24 (sum of resistors 26, 28), $R_{tuned}$ is the value of the tunable resistor 130, and $R_{fix(plg)}$ is the value of the fixed resistor 140.

A method of designing the compensated calibration circuit 100 includes determining the minimum and maximum values for the fixed resistor 140, based on the minimum and maximum values for the external resistance network 20 and a chosen tunable resistor 130. The following method assumes a resistance of 40 ohms (Ω), however, this is for exemplary purposes only, and other small resistances are applicable.

First, a minimum and maximum resistance for the parasitic distribution resistance 24 ($R_{dist}$) is determined. For example, the minimum resistance may be 0.25Ω and the maximum resistance may be 3.25Ω. Based on the minimum and maximum parasitic distribution resistances, and the precision target resistor 22 ($R_{ext(tgt)}$), the minimum and maximum values for the external resistance network 20 are calculated. For example, the minimum resistance of the external resistance network 20 may be 40.25Ω and the maximum resistance of the external resistance network 20 may be 43.25Ω (i.e., $R_{dist}$+ $R_{ext(tgt)}$ for the minimum $R_{dist}$ and the maximum $R_{dist}$).

For a chosen tunable resistor 130, the minimum and maximum values for the fixed resistor 140 are calculated. For example, the tunable resistor 130 may be 31.5Ω The total resistance of the external resistance network 20 is equal to the total resistance of the variable resistor network 100. Therefore, following the example, the minimum value for the fixed resistor 140 would be 8.75Ω (i.e., subtract the tunable resistor 130 from the total minimum value for the external resistance network 20). That is, 40.25Ω–31.5Ω.

For the maximum value for the fixed resistor 140, the same equation would apply. However, the total maximum value for the external resistance network 20 is 43.25Ω. Therefore, the maximum fixed resistor 140 value is 11.25Ω (e.g, 43.25Ω–31.5Ω).

The tunable resistor 130 may be chosen, based on a comparison of the output voltage of the variable resistor network 100 ("PADR") to the reference voltage ("VREF") via comparator 40 (FIG. 2). Further, once the maximum and minimum values for the fixed resistor 140 are chosen, a number of values that can be selected for fixed resistor 140 for a desired tolerance are determined. For example, in the example above, if the range is from 8.75Ω to 11.25Ω for the fixed resistor 140, if six (6) resistors can be selected for fixed resistor 140, there would be a step of 0.5Ω per resistor. Therefore, the resistance for fixed resistor 140 may be 8.75Ω, 9.25Ω, 9.75Ω, 10.25Ω, 10.75Ω, and 11.25Ω.

Figure 4:
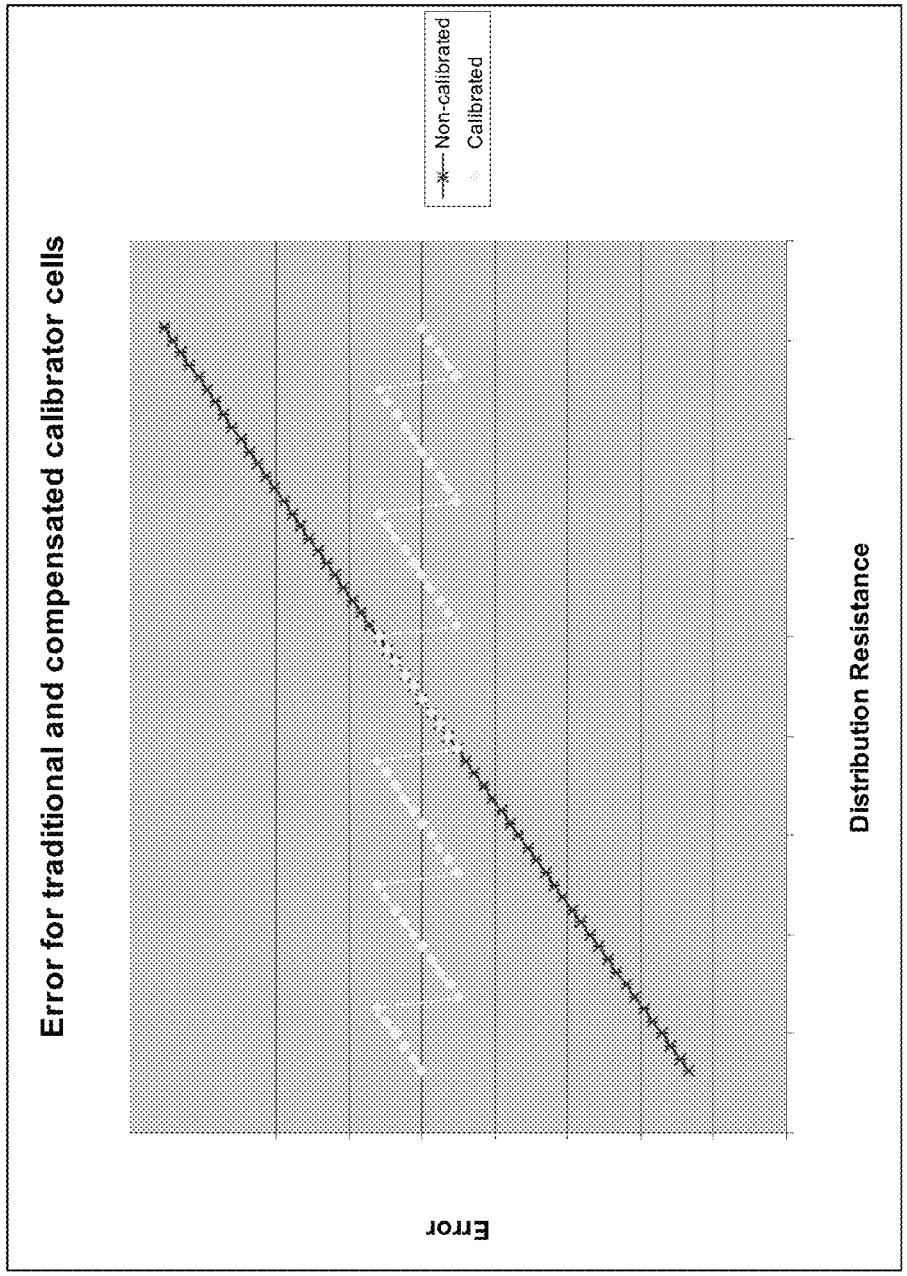
FIG. 4 shows a graph of comparing the error due to distribution resistance in a traditional and a compensated calibration circuit.

Turning now to FIG. 4, a graph comparing the error due to distribution resistance in a traditional and a compensated calibration circuit, such as the circuit 100 shown in FIG. 3, is shown. As the distribution resistance increases, for a traditional calibration circuit, the error increases linearly. However, with a compensated calibration circuit, the error range is reduced significantly. Therefore, the parasitic distribution resistance 24 (i.e., from resistors 26, 28) does not take up a large portion of the tolerance budget.

Figure 5:
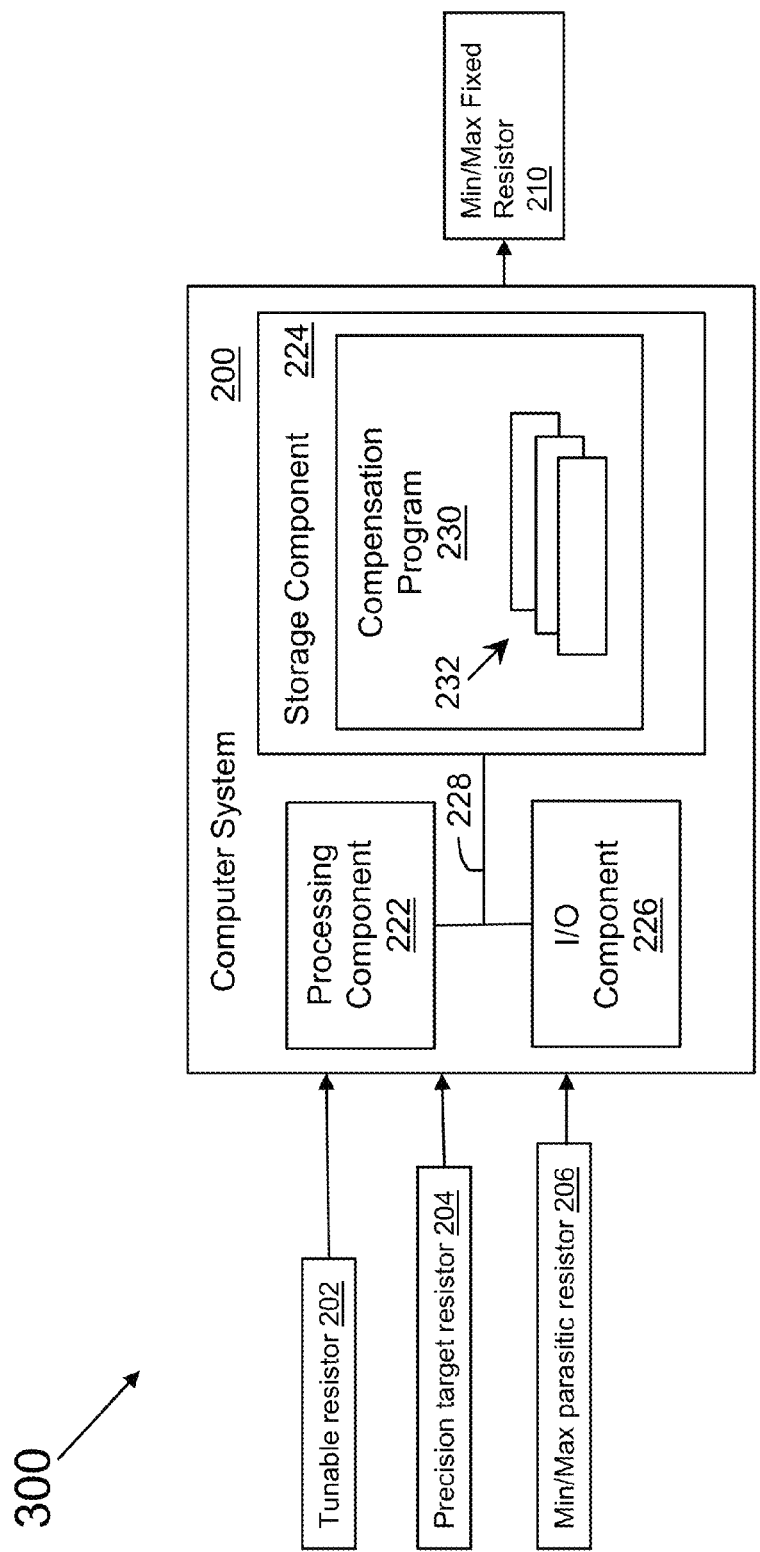
FIG. 5 is an illustrative environment for designing a compensated calibration circuit according to embodiments of the invention.

FIG. 5 shows an illustrative environment 300 for designing a compensated calibration circuit according to an embodiment. To this extent, environment 300 includes a computer system 200 that can perform a process described above in order to design a compensated calibration circuit. In particular, computer system 200 is shown including a compensation program 230, which makes computer system 200 operable to design a compensated calibration circuit by performing a process described above.

That is, when a chosen tunable resistor 202, precision target resistor 204, and the minimum and maximum resistance for the parasitic distribution resistor 206 is determined, the minimum and maximum values for the fixed resistor 210 may determined, using the method described above, with compensation program 230.

Computer system 200 is shown including a processing component 222 (e.g., one or more processors), a storage component 224 (e.g., a storage hierarchy), an input/output (I/O) component 226 (e.g., one or more I/O interfaces and/or devices), and a communications pathway 228. In general, processing component 222 executes program code, such as compensation program 230, which is at least partially fixed in storage component 224. While executing program code, processing component 222 can process data, which can result in reading and/or writing transformed data from/to storage component 224 and/or I/O component 226 for further processing. Pathway 228 provides a communications link between each of the components in computer system 200.

In any event, computer system 200 can comprise one or more general purpose computing articles of manufacture (e.g., computing devices) capable of executing program code, such as compensation program 230, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, compensation program 230 can be embodied as any combination of system software and/or application software.

Further, compensation program 230 can be implemented using a set of modules 232. In this case, a module 232 can enable computer system 200 to perform a set of tasks used by compensation program 230, and can be separately developed and/or implemented apart from other portions of compensation program 230. As used herein, the term "component" means any configuration of hardware, with or without software, which implements the functionality described in conjunction therewith using any solution, while the term "module" means program code that enables a computer system 200 to implement the actions described in conjunction therewith using any solution. When fixed in a storage component 224 of a computer system 200 that includes a processing component 222, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 200.

When computer system 200 comprises multiple computing devices, each computing device can have only a portion of compensation program 230 fixed thereon (e.g., one or more modules 232). However, it is understood that computer system 200 and compensation program 230 are only representative of various possible equivalent computer systems that may perform a process described herein. To this extent, in other embodiments, the functionality provided by computer system 200 and compensation program 230 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 200 includes multiple computing devices, the computing devices can communicate over any type of communications link. Further, while performing a process described herein, computer system 200 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A compensated impedance calibration circuit, comprising:
   a variable resistor network including a tunable resistor and a fixed resistor; and
   an external resistance network including a target external precision resistor and a parasitic distribution resistance,
   wherein a resistance of the variable resistor network is proportional to a resistance of the external resistance network, such that a ratio of an output voltage of the variable resistor network to a power supply voltage is constant,
   wherein a value for the fixed resistor is selected from a range of discrete values, the range of discrete values including:
      a minimum value represented by $(R_{ext(tgt)}+R_{distmin})-R_{tuned}$; and
      a maximum value represented by $(R_{ext(tgt)}+R_{distmax})-R_{tuned}$,
      wherein $R_{ext(tgt)}$ is a resistance value of the target external precision resistor, $R_{distmin}$ is a minimum resistance value of the parasitic distribution resistance, $R_{distmax}$ is a maximum resistance value of the parasitic distribution resistance, and $R_{tuned}$ is a resistance value of the tunable resistor.

2. The compensated impedance calibration circuit of claim 1, further comprising a voltage reference generator for generating a reference voltage.

3. The compensated impedance calibration circuit of claim 2, further comprising a comparator for comparing the reference voltage to the output voltage of the variable resistor network.

4. The compensated impedance calibration circuit of claim 3, further comprising control logic for receiving an output of the comparator and for tuning the variable resistor network, such that the output voltage of the variable resistor network is equal to the reference voltage.

5. The compensated impedance calibration circuit of claim 3, further comprising control logic for receiving an output of the comparator and for tuning the variable resistor network, such that the output voltage of the variable resistor network is equal to the reference voltage.

6. The compensated impedance calibration circuit of claim 1, wherein the fixed resistor is a pluggable on-chip resistor.

7. The compensated impedance calibration circuit of claim 1, wherein the value for the fixed resistor in the range of discrete values depends upon a resistance of the external resistance network.

8. The compensated impedance calibration circuit of claim 1, wherein the ratio of the output voltage of the variable resistor network (PADR) to the power supply voltage (DVDD) is represented by:

$$\frac{PADR}{DVDD} = \frac{R_{ext(tgt)} + R_{dist}}{R_{tuned} + R_{fix(plg)} + R_{ext(tgt)} + R_{dist}},$$

wherein $R_{dist}$ is a resistance value of the parasitic distribution resistance.

9. A compensated impedance calibration circuit, comprising:
- a variable resistor network including a tunable resistor and a fixed resistor; and
- an external resistance network including a target external precision resistor and a parasitic distribution resistance,
- wherein a total resistance of the variable resistor network is equal to a total resistance of the external resistance network, such that a ratio of an output voltage of the variable resistor network to a power supply voltage is constant,
- wherein the ratio of the output voltage of the variable resistor network (PADR) to the power supply voltage (DVDD) is represented by:

$$\frac{PADR}{DVDD} = \frac{R_{ext(tgt)} + R_{dist}}{R_{tuned} + R_{fix(plg)} + R_{ext(tgt)} + R_{dist}},$$

wherein $R_{ext(tgt)}$ is a resistance value of the target external precision resistor, $R_{dist}$ is a resistance value of the parasitic distribution resistance, $R_{tuned}$ is a resistance value of the tunable resistor, and $R_{fix(plg)}$ is a resistance value of the fixed resistor.

10. The compensated impedance calibration circuit of claim 9, further comprising a voltage reference generator for generating a reference voltage.

11. The compensated impedance calibration circuit of claim 10, further comprising a comparator for comparing the reference voltage to the output voltage of the variable resistor network.

12. The compensated impedance calibration circuit of claim 9, wherein the fixed resistor is a pluggable on-chip resistor.

13. The compensated impedance calibration circuit of claim 9, wherein the value for the fixed resistor in the range of discrete values depends upon a resistance of the external resistance network.

* * * * *